United States Patent
Choi et al.

(10) Patent No.: US 10,008,398 B2
(45) Date of Patent: Jun. 26, 2018

(54) SUBSTRATE THINNING APPARATUS, METHOD OF THINNING SUBSTRATE BY USING THE SAME, AND METHOD OF FABRICATING SEMICONDUCTOR PACKAGE

(71) Applicant: Samsung Electronics Co., Ltd., Suwon-si, Gyeonggi-do (KR)

(72) Inventors: Sang-il Choi, Yongin-si (KR); Byung-ho Kim, Cheonan-si (KR); Hong-seok Choi, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days. days.

(21) Appl. No.: 15/369,138

(22) Filed: Dec. 5, 2016

(65) Prior Publication Data

US 2017/0207108 A1    Jul. 20, 2017

(30) Foreign Application Priority Data

Jan. 18, 2016  (KR) ........................ 10-2016-0005994

(51) Int. Cl.
| | |
|---|---|
| *H01L 21/00* | (2006.01) |
| *H01L 21/67* | (2006.01) |
| *H01L 21/687* | (2006.01) |
| *B24B 41/06* | (2012.01) |
| *B24B 49/12* | (2006.01) |
| *B24B 55/02* | (2006.01) |
| *B24B 7/22* | (2006.01) |

(52) U.S. Cl.
CPC ........ *H01L 21/67092* (2013.01); *B24B 7/228* (2013.01); *B24B 41/068* (2013.01); *B24B 49/12* (2013.01); *B24B 55/02* (2013.01); *H01L 21/68714* (2013.01); *H01L 21/67051* (2013.01)

(58) Field of Classification Search
CPC .............................. B24B 1/00; H01L 21/6836
See application file for complete search history.

(56) References Cited

U.S. PATENT DOCUMENTS

| | | | |
|---|---|---|---|
| 6,095,897 A * | 8/2000 | Stocker | ................. B23Q 3/186 257/E21.23 |
| 6,098,901 A | 8/2000 | Mok et al. | |
| 6,595,196 B2 * | 7/2003 | Bath | .................... B24B 55/052 125/13.01 |
| 8,765,653 B2 | 7/2014 | Tamboli et al. | |

(Continued)

FOREIGN PATENT DOCUMENTS

| | | |
|---|---|---|
| KR | 2003/0047493 A | 6/2003 |
| KR | 10-0884939 B1 | 2/2009 |

(Continued)

*Primary Examiner* — Julio J Maldonado
*Assistant Examiner* — Andre' C Stevenson
(74) *Attorney, Agent, or Firm* — Harness, Dickey & Pierce, P.L.C.

(57) ABSTRACT

A substrate thinning apparatus includes a chuck table capable of supporting a substrate, a rotatable grinding device which includes a wheel tip capable of grinding the substrate supported by the chuck table, and a cleaning device configured to perform synchronized cleaning of the wheel tip while the grinding device is rotated. When the substrate thinning apparatus is used, even an extremely thin semiconductor device can be fabricated with substantial reliability.

18 Claims, 16 Drawing Sheets

(56) References Cited

U.S. PATENT DOCUMENTS

| | | |
|---|---|---|
| 8,915,771 B2 | 12/2014 | Vogtmann |
| 2007/0298587 A1* | 12/2007 | Park .................. B23K 26/0732 438/458 |
| 2010/0009519 A1* | 1/2010 | Seddon ............... H01L 21/6836 438/464 |
| 2011/0165823 A1* | 7/2011 | Ide .......................... B24B 37/00 451/41 |
| 2011/0241178 A1* | 10/2011 | Miki .................. H01L 21/6836 257/620 |
| 2012/0034147 A1 | 2/2012 | Okita |
| 2012/0289126 A1* | 11/2012 | Tanikella .......... H04L 29/12028 451/41 |
| 2013/0185884 A1 | 7/2013 | Ko et al. |
| 2014/0202491 A1 | 7/2014 | Vogtmann et al. |

FOREIGN PATENT DOCUMENTS

| | | |
|---|---|---|
| KR | 2011/0004336 A | 1/2011 |
| KR | 2015/0060126 A | 6/2015 |

\* cited by examiner

US 10,008,398 B2

SUBSTRATE THINNING APPARATUS, METHOD OF THINNING SUBSTRATE BY USING THE SAME, AND METHOD OF FABRICATING SEMICONDUCTOR PACKAGE

CROSS-REFERENCE TO RELATED APPLICATION

This application claims the benefit of priority from Korean Patent Application No. 10-2016-0005994, filed on Jan. 18, 2016, in the Korean Intellectual Property Office, the disclosure of which is incorporated herein in its entirety by reference.

BACKGROUND

As there is continuous demand to produce lighter, thinner, shorter, and smaller semiconductor products while the sizes of the semiconductor products are reduced, several processes for satisfying the demand are being tried and applied. A process of reducing a thickness of a semiconductor substrate by thinning the semiconductor substrate includes a process of grinding a back surface of the semiconductor substrate, and as a target thickness of the semiconductor substrate decreases, it is typically more difficult to maintain the reliability of a semiconductor device.

SUMMARY

The inventive concepts relates to a substrate thinning apparatus, a method of thinning a substrate by using the same, and a method of fabricating a semiconductor package, and more particularly, to a substrate thinning apparatus, which allows even a significantly thin semiconductor device to be fabricated with substantial reliability, a method of thinning a substrate by using the same, and a method of fabricating a semiconductor package.

The inventive concepts provide a substrate thinning apparatus which allows even a significantly thin semiconductor device to be fabricated with substantial reliability.

The inventive concepts also provide a method of thinning a substrate, the method allowing even a significantly thin semiconductor device to be fabricated with substantial reliability.

The inventive concepts also provide a method of fabricating a semiconductor package that is thin and has substantial reliability.

According to example embodiments, a substrate thinning apparatus includes a chuck table capable of supporting, or configured to support, a substrate, a rotatable grinding device which includes a wheel tip capable of grinding, or configured to grind, the substrate supported by the chuck table, and a cleaning device configured to perform synchronized cleaning of the wheel tip while the grinding device is in rotation.

According to another example embodiment, a method of thinning a substrate includes fixing a substrate onto a chuck table, at least partially grinding the substrate by rotating a grinding device including a wheel tip, and performing synchronized cleaning of the wheel tip.

According to a further example embodiment, a method of fabricating a semiconductor package includes forming a semiconductor device on an active surface of a substrate, attaching a protective film onto the active surface of the substrate, fixing the substrate onto a chuck table such that the active surface of the substrate faces the chuck table, at least partially grinding the substrate by rotating a grinding device including a wheel tip, performing synchronized cleaning of the wheel tip, separating the grinded substrate into individual semiconductor dies, and fabricating a semiconductor package by mounting the individual semiconductor dies.

Example embodiments relate to a method for grinding a substrate, the method including fixedly attaching a substrate to a support, at least partially grinding the substrate by rotating a grinding device including a plurality of wheel tips, at least one of the plurality of wheel tips being in contact with at least a portion of the substrate, and projecting a compressed fluid onto the at least one of the plurality of wheel tips, wherein the projecting is performed contemporaneously with the at least partial grinding.

BRIEF DESCRIPTION OF THE DRAWINGS

Embodiments of the inventive concepts will be more clearly understood from the following detailed description taken in conjunction with the accompanying drawings in which:

FIG. 2A is a perspective view illustrating a substrate being thinned by wheel tips, and FIG. 2B is a side view illustrating the same;

DETAILED DESCRIPTION

Figure 1:
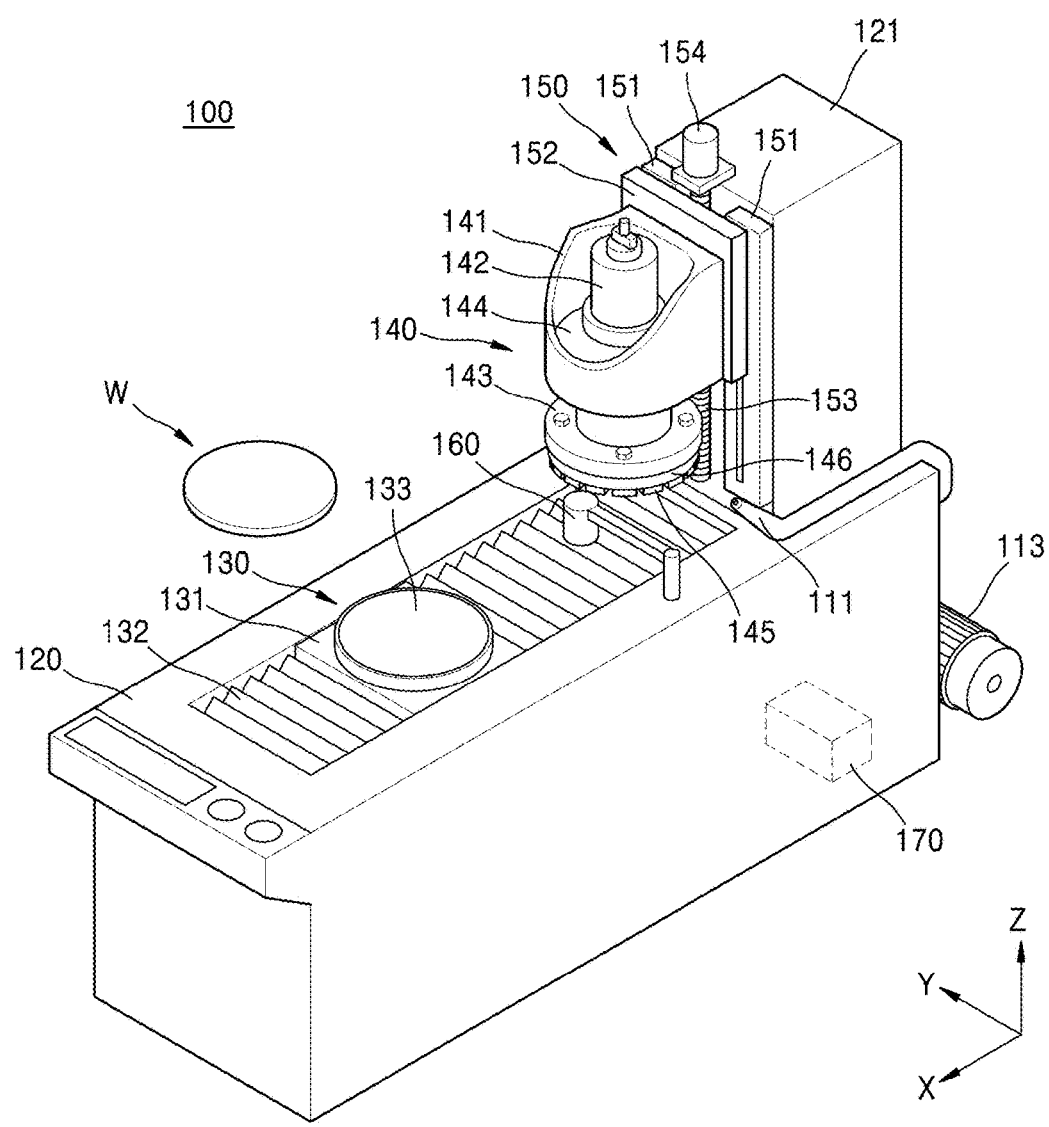
FIG. 1 is a perspective view of a substrate thinning apparatus according to an embodiment.

These and other features and advantages are described in, or are apparent from, the following detailed description of various example embodiments.

It will be understood that when an element is referred to as being "on," "connected" or "coupled" to another element, it can be directly on, connected or coupled to the other element or intervening elements that may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a perspective view of a substrate thinning apparatus 100 according to an example embodiment. A substrate thinning apparatus according to example embodiments is not limited to a configuration of an apparatus for a grinding process, and may be a portion of a processing apparatus by which a series of processes, for example, a grinding process, another grinding process, a cleaning process, and the like, may be consecutively performed or performed in a different order.

Referring to FIG. 1, a rectangular opening extending in an X direction may be formed in an upper surface of a base frame 120 of the substrate thinning apparatus 100. The rectangular opening may be covered by a moving plate 131 and a substantially waterproof cover 132, the moving plate 131 being movable together with a chuck table 130. A moving device, which moves the chuck table 130 in the X direction, a Y direction, and/or a Z direction, may be provided under the substantially waterproof cover 132.

A surface of the chuck table 130 may be a supporting surface 133 sucking and supporting a substrate W via a porous plate. The supporting surface 133 may be connected to a suction source through a flow path inside the chuck table 130, and the substrate W may be sucked and fixed by a negative pressure applied to the supporting surface 133.

A column unit 121 may be provided behind the opening of the base frame 120. A moving device 150 capable of moving a grinding device 140 up and down along the Z direction may be provided to the column unit 121. A pair of guide rails 151 substantially parallel in the Z direction may be arranged on the column unit 121, and a motor-driven Z-axis table 152 slidably mounted on the pair of guide rails 151 may be provided to the moving device 150.

A nut portion may be formed at the back side of the Z-axis table 152, and a ball screw 153 may be screw-coupled to the nut portion. In addition, the ball screw 153 may be rotated by a driving motor 154 connected to one end of the ball screw 153, whereby the grinding device 140 may be moved in the Z direction along the pair of guide rails 151.

The grinding device 140 may be mounted on a front surface of the Z-axis table 152 via a housing 141, and may include a cylindrical spindle 142 and a mount 143 at a lower end of the cylindrical spindle 142. A flange 144 spreading in a radial direction of the spindle 142 may be mounted to the spindle 142, and other portions of the grinding device 140 may be supported by the housing 141 via the flange 144. A grinding wheel 146 including a plurality of wheel tips 145 substantially circularly arranged may be mounted on a lower surface of the mount 143. The plurality of wheel tips 145 may be, for example, a diamond whetstone which is obtained by bonding particles for grinding diamond by means of a binder such as a vitrified bond, a metal bond, or a resin bond, followed by hardening the binder.

A measurement means 160 measuring a height of an upper surface of the substrate W may be provided at one side of the grinding device 140. The measurement means 160 may be a contact-type or noncontact-type height gauge. For example, the measurement means 160 may be a noncontact-type height gauge which includes a light emitting portion and a light receiving portion and measures the height of the upper surface of the substrate W based on the light emitting portion and the light receiving portion, the light receiving portion receiving light which is emitted from the light emitting portion and then reflected by the substrate W.

A cleaning device 111 configured to perform synchronized cleaning of the wheel tips 145 may be provided at another side of the grinding device 140. Here, the expression "synchronized cleaning of the wheel tips 145" means that the wheel tips 145 of the grinding device 140 are simultaneously or contemporaneously cleaned while the grinding is performed by the wheel tips 145.

The cleaning device 111 may be, for example, a nozzle capable of jetting or projecting a fluid. When the cleaning device 111 jets a fluid, a direction of the nozzle may be adjusted such that the jetted fluid directly contacts the wheel tips 145. In addition, a pressurizing device 113 may be further provided, the pressurizing device 113 pressurizing the fluid jetted from the cleaning device 111 to allow the fluid jetted at a sufficient jet pressure to be brought into contact with the wheel tips 145. The pressurizing device 113 may be, for example, a pump, and may be connected to the cleaning device 111.

A controller 170 collectively controlling each or at least one part of the substrate thinning apparatus 100 may be provided to the substrate thinning apparatus 100. The controller 170 may include a processor, a memory, and the like, the processor executing various processes. The memory may include one or more storage media such as read-only memory (ROM), random access memory (RAM), and the like, depending upon purposes of the memory.

In the substrate thinning apparatus 100, the grinding device 140 may approach the chuck table 130 while the grinding wheel 146 is rotated around a Z axis by the spindle 142. Grinding water is supplied to the substrate W, and the wheel tips 145 are brought into contact with the substrate W while rotating, whereby the substrate W may be thinned. The grinding water is a liquid supplied in order to cool the grinding wheel 146 during the grinding and to provide lubrication between the wheel tips 145 and the substrate W. Since the grinding water is not directly supplied to the wheel tips 145, the grinding water is significantly different from the fluid, which is jetted from the cleaning device 111 and will be described below, in terms of a supply purpose, a supply manner, a configuration of a device supplying the fluid, and the like.

The wheel tips 145 are continuously cleaned by the cleaning device 111 while the grinding is performed, whereby foreign substances, which may cause scratches on a surface of the substrate W, may be removed.

Figure 2A:
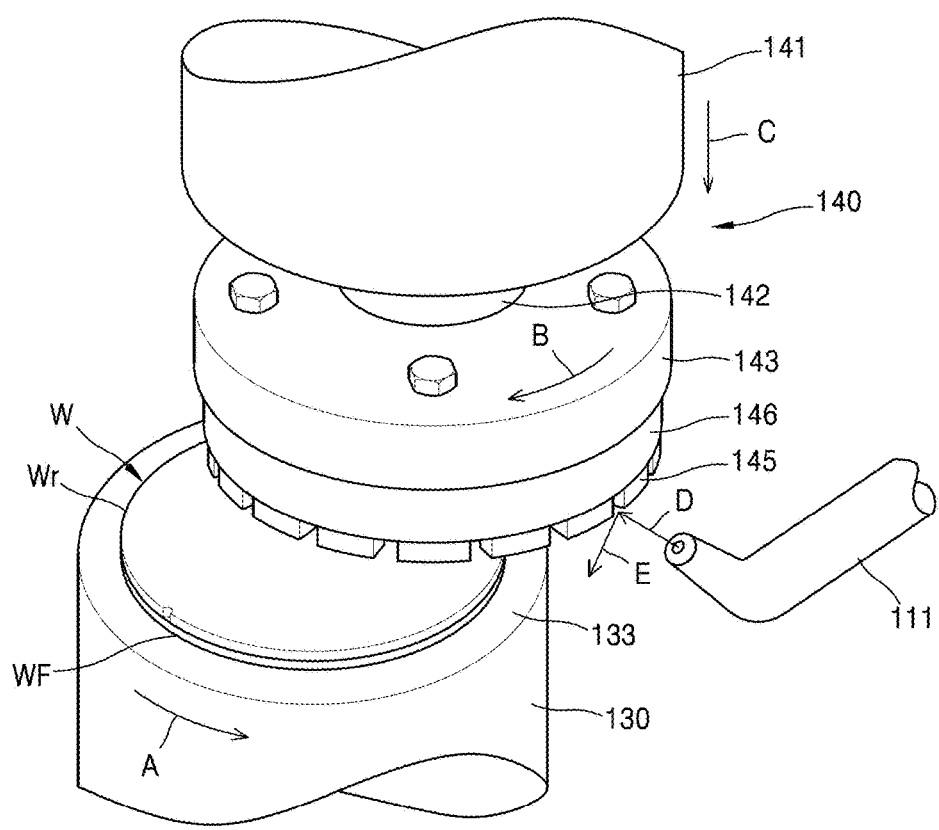
FIGS. 2A and 2B are diagrams illustrating a method of thinning a substrate in more detail, where
Figure 2B:
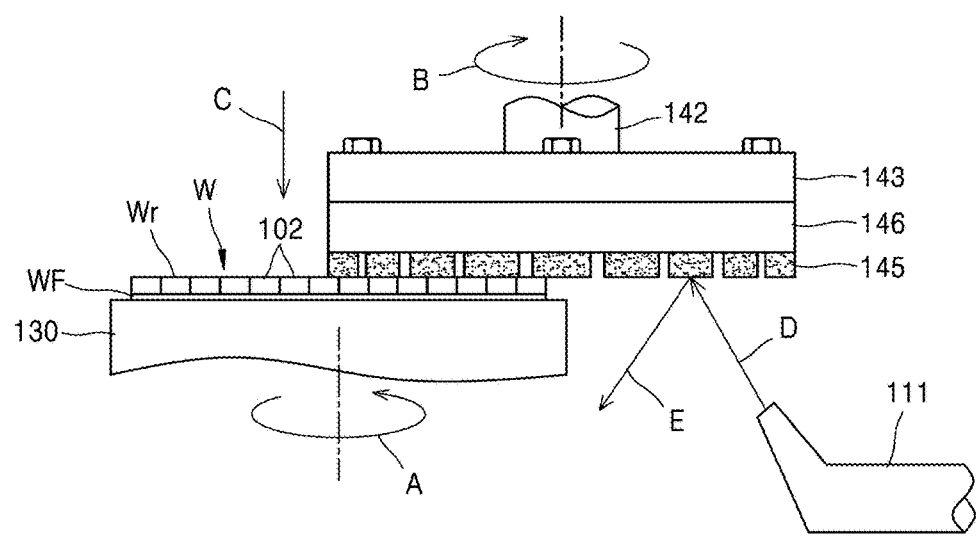

FIGS. 2A and 2B are diagrams illustrating a method of thinning the substrate W in more detail. FIG. 2A is a perspective view illustrating the substrate W being thinned by the wheel tips 145, and FIG. 2B is a side view illustrating the same.

Referring to FIGS. 2A and 2B, the substrate W may be fixed to the supporting surface 133 of the chuck table 130. The substrate W may be arranged such that an active surface of the substrate W, on which semiconductor devices are formed, faces the supporting surface 133. As a result, a rear surface Wr of the substrate W faces the grinding device 140.

In addition, a protective film WF may be attached onto the active surface of the substrate W. As described with reference to FIG. 1, the supporting surface 133 may be connected to the suction source through the flow path inside the chuck table 130, and the substrate W may be sucked and fixed by a negative pressure applied to the supporting surface 133.

The chuck table 130 supporting the substrate W may be rotated at a rotation speed of about 200 rpm to about 400 rpm in a direction of an arrow A. Simultaneously or contemporaneously, the grinding wheel 146 of the grinding device 140 may be rotated at a rotation speed of about 1500 rpm to about 7200 rpm in a direction of an arrow B. In some example embodiments, the rotation rate, measured in revolutions per minute, of the grinding wheel 146 may be about 5 times to about 20 times the revolutions per minute of the chuck table 130.

While the grinding wheel 146 is rotated, the wheel tips 145 of the grinding wheel 146 may contact the rear surface Wr of the substrate W, which is a processing target surface, and in particular, the grinding wheel 146 may be moved down, for example, at a forward-speed of about 1 μm/sec, in a direction of arrow C. The advance of the grinding wheel 146 may continue until the substrate W has a desired thickness, for example, a thickness of about 10 μm to about 200 μm.

In some example embodiments, the substrate W may be separated into individual semiconductor dies 102 by the grinding of the substrate W. Since the protective film WF is attached onto active surfaces of the individual semiconductor dies 102 that are separated, the individual semiconductor dies 102 may be maintained at substantially original positions thereof instead of being disorderedly scattered.

The cleaning device 111 may be provided at one lower side of the grinding wheel 146. As shown in FIGS. 2A and 2B, impurities on the wheel tips 145 may be removed by the fluid jetted from the cleaning device 111.

Figure 3:
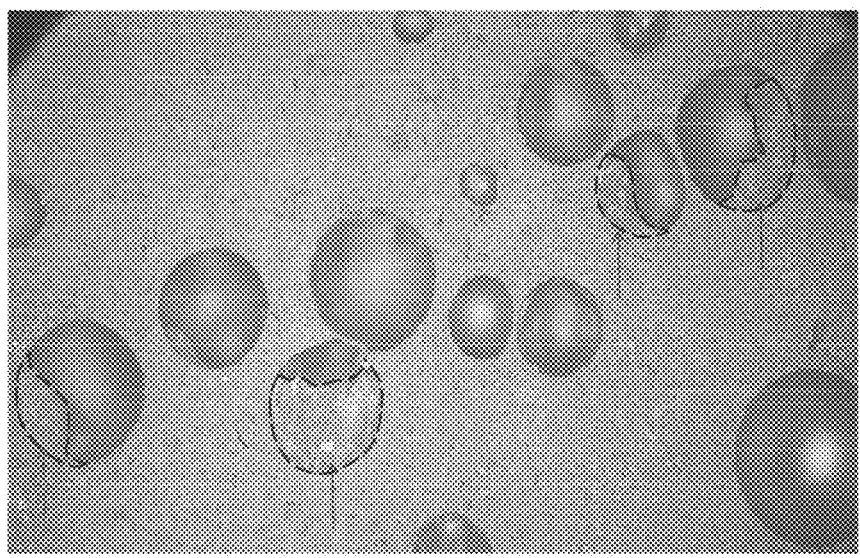
FIG. 3 is an enlarged image of a surface of a wheel tip immediately or shortly after grinding.

FIG. 3 is an enlarged image of a surface of the wheel tip 145 immediately or shortly after the grinding. Referring to FIG. 3, it is observed that foreign substances generated due to the grinding at least partially fill a large number of pores present on the surface of the wheel tip 145 (see portions inside the pores, the portions being marked by a dashed line and indicated by arrows).

Such foreign substances may be sludge of the substrate W generated due to the grinding of the rear surface of the substrate W, may be materials dropped out of the wheel tips 145, for example, dropped diamond microparticles, or may be a binder such as a vitrified bond. If the foreign substances are accumulated in the pores, since scratches may be generated when the substrate W is grinded by the wheel tips 145, the semiconductor devices may be damaged.

As shown in FIGS. 2A and 2B, the foreign substances may be removed by cleaning the wheel tips 145 by using the cleaning device 111, thereby reducing or substantially preventing scratches from being generated on the substrate W during the grinding of the substrate W.

The fluid may be a liquid, a gas, or a mixture thereof. In some example embodiments, the fluid may include at least one of air, nitrogen ($N_2$), helium (He), neon (Ne), water, ammonia, alcohol, and mixtures thereof. Here, the liquids such as water, alcohol, and ammonia may further include a surfactant.

When the fluid is a mixture of a liquid and a gas, the liquid may be atomized by the gas and jetted. That is, when the gas flows at a high linear velocity, followed by exposing the liquid to the flow of the gas, a mixture of droplets and the gas may be formed, as the liquid is quickly atomized. In addition, the mixture of the droplets and the gas strikes the surfaces of the wheel tips 145, thereby facilitating removal of the foreign substances. In some example embodiments, the atomized liquid may be water, and the liquid used for atomizing the liquid may be air.

In addition, when the cleaning device 111 jets the fluid, a direction of the cleaning device 111 may be adjusted such that the jetted fluid is directed toward the wheel tips 145. By doing this, the fluid may clean the wheel tips 145 along paths denoted by arrows D and E.

Figure 4:
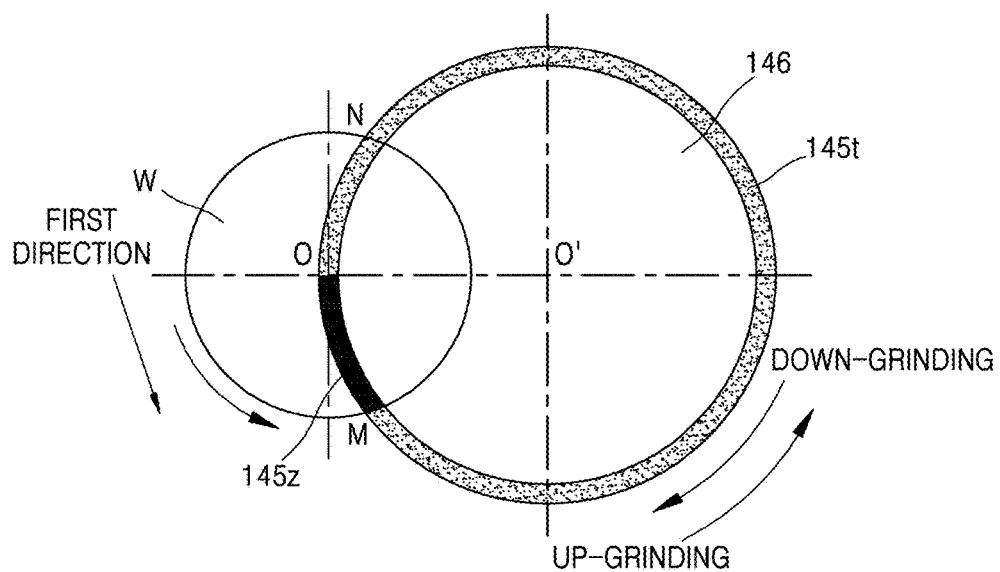
FIG. 4 is a plan view illustrating a positional relationship between a grinding wheel and a substrate when the substrate is grinded by the grinding wheel.

FIG. 4 is a plan view illustrating a positional relationship between the grinding wheel 146 and the substrate W when the substrate W is grinded by the grinding wheel 146.

Referring to FIG. 4, the substrate W is shown as rotating around a center O, and the grinding wheel 146 is shown as rotating around a center O'. Since the substrate W rotates while fixed to the chuck table 130, a rotation center of the substrate W may be substantially equal to a rotation center of the chuck table 130. Here, although the substrate W is shown as rotating in a counterclockwise direction, the substrate W may rotate in a clockwise direction.

The rotation center O of the substrate W and the rotation center O' of the grinding wheel 146 may disaccord with each other. In some example embodiments, the rotation center O' of the grinding wheel 146 may be located outside the substrate W, as shown in FIG. 4.

In FIG. 4, a shaded portion along an outer circumference of the grinding wheel 146 is a wheel tip trace 145t, and represents a path through which the wheel tips 145 (see FIGS. 2A and 2B) pass along with the rotation of the grinding wheel 146. An overall portion, in which the wheel tip trace 145t overlaps the substrate W, may not be used for the grinding of the substrate W. In some example embodiments, the grinding may be actually performed only in a grinding zone 145z of the wheel tip trace 145t, the grinding zone 145z being defined by the center O of the substrate W and a first-direction edge M. As such, to perform the grinding only in the grinding zone 145z, which is a portion of the wheel tip trace 145t overlapping the substrate W, the supporting surface 133 (see FIG. 1) supporting the substrate W may not be completely planar. In some example embodiments, the supporting surface 133 of the chuck table 130 may have a conical shape which has a decreasing height with increasing distance from the center of the chuck table 130 having a peak height toward the outer circumference of the chuck table 130.

Figure 5:
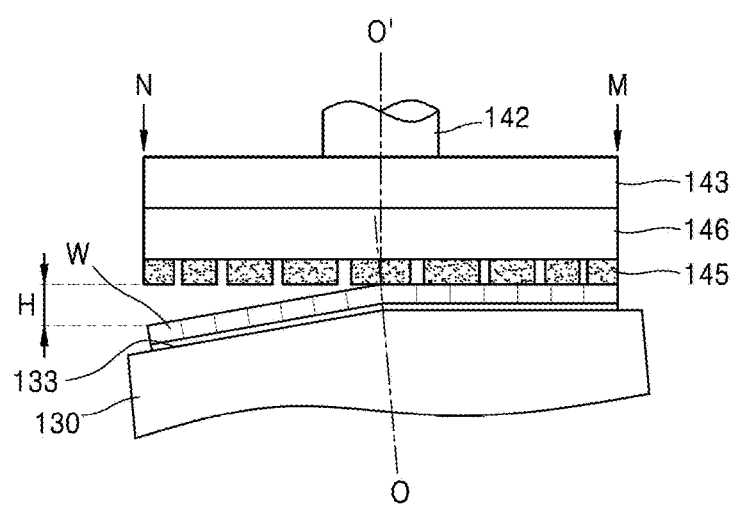
FIG. 5 is a side view for conceptually illustrating a positional relationship between a chuck table having a non-planar support surface and a grinding wheel.

FIG. 5 is a side view for conceptually illustrating a positional relationship between the chuck table 130 having the non-planar support surface 133 and the grinding wheel 146.

Referring to FIG. 5, the supporting surface 133, which is an upper surface of the chuck table 130, may have a conical shape. As shown in FIG. 5, the supporting surface 133 has a conical shape which has a decreasing height with increasing distance from the center O of the chuck table 130 having a peak height toward the outer circumference of the chuck table 130. It should be noted that the conical shape in FIG. 5 is exaggerated for convenience.

A slope of the chuck table 130 may be adjusted such that the grinding zone 145z between the center O of the substrate W and the first-direction edge M is substantially parallel to a plane formed by lower surfaces of the wheel tips 145. When such a configuration is used, the grinding may be performed only or mostly in the grinding zone 145z out of the region in which the wheel tip trace 145t overlaps the substrate W, as shown in FIG. 4.

In a region between the center O of the substrate W and an edge N opposite the grinding zone 145z, since there is a gap between the substrate W and the wheel tips 145, the grinding may not be performed. A maximum value H of the gap between the substrate W and the wheel tips 145 may be several tens of micrometers, for example, may range from about 15 μm to about 50 μm.

Referring again to FIG. 4, while the wheel tips 145 are rotated for the grinding, at least some of the wheel tips 145 may not overlap the surface of the substrate W which is being grinded. In other words, although there may be a portion of the wheel tip trace 145t, which overlaps the substrate W, there may be a portion of the wheel tip trace 145t, which does not overlap the substrate W.

For this purpose, the center O of the substrate W may disaccord with the center O' of the grinding wheel 146, as described above. In addition, the radius of the grinding wheel 146 may be greater than the radius of the substrate W. In particular, positions of the substrate W and the grinding wheel 146 may be adjusted such that the wheel tip trace 145t passes through the center O of the substrate W.

As shown in FIG. 4, a rotation direction of the grinding wheel 146 may be a clockwise direction or a counterclockwise direction. When the grinding wheel 146 rotates in the clockwise direction, the grinding wheel 146 is brought into contact with the substrate W in a direction from the first-direction edge M of the substrate W toward the center O of the substrate W. When the grinding wheel 146 rotates in the counterclockwise direction, the grinding wheel 146 is brought into contact with the substrate W in a direction from the center O of the substrate W toward the first-direction edge M of the substrate W.

Although the cleaning device 111 is shown as including one nozzle in FIGS. 1, 2A, and 2B, the cleaning device 111 may include two or more nozzles.

Figure 6A:
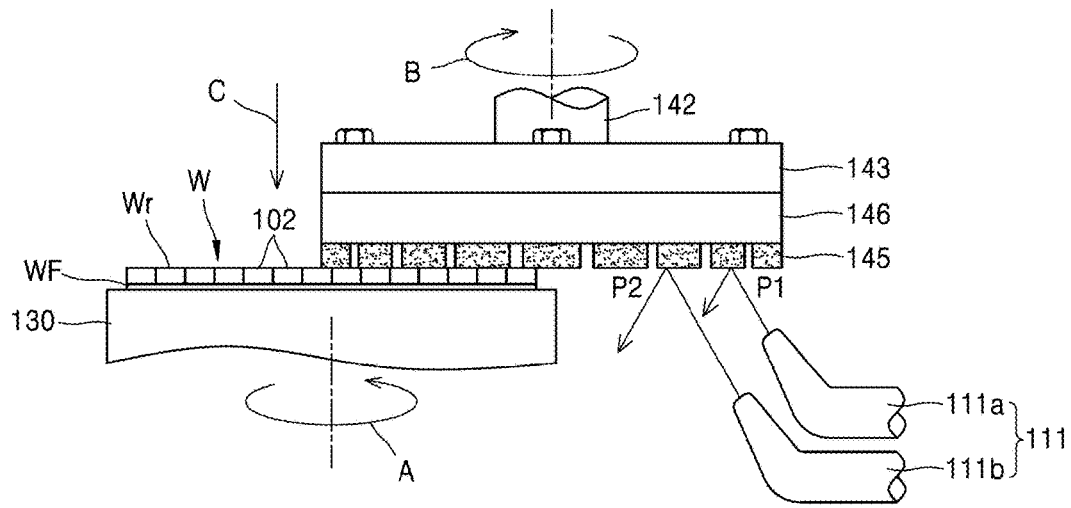
FIGS. 6A and 6B are respectively a side view and a plan view illustrating an example embodiment in which a cleaning device includes two or more nozzles.
Figure 6B:
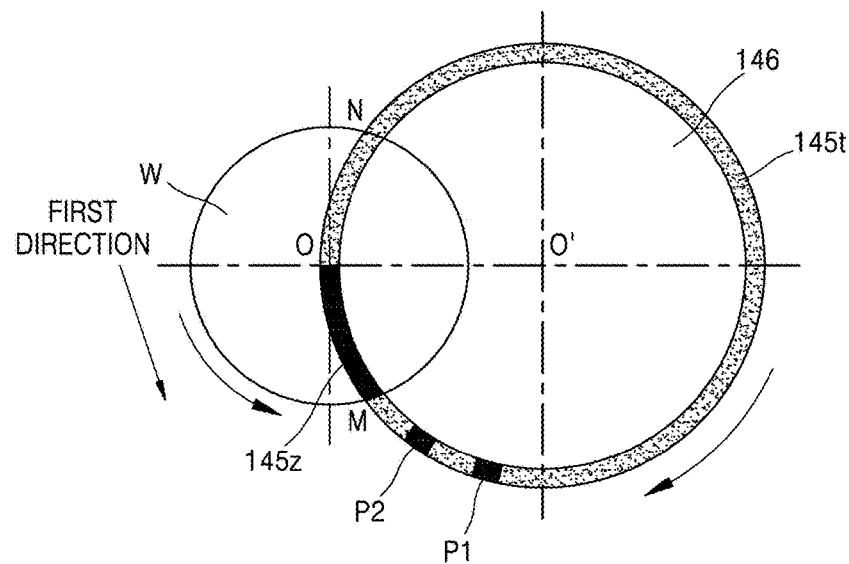

FIGS. 6A and 6B are respectively a side view and a plan view illustrating an example embodiment in which the cleaning device 111 includes two or more nozzles.

Referring to FIGS. 6A and 6B, the cleaning device 111 may include a first sub-nozzle 111a and a second sub-nozzle 111b. Directions of the first sub-nozzle 111a and the second sub-nozzle 111b may be adjusted such that the first sub-nozzle 111a and the second sub-nozzle 111b respectively aim at a position P1 and a position P2 of the wheel tips 145.

In some example embodiments, the same fluid may be jetted through the first sub-nozzle 111a and the second sub-nozzle 111b. Since the wheel tips 145 sequentially pass through the position P1 and position P2 and thus may be cleaned twice, the wheel tips 145 can be more perfectly cleaned.

In some example embodiments, different fluids may be jetted through the first sub-nozzle 111a and the second sub-nozzle 111b. For example, a gas may be jetted through the first sub-nozzle 111a, and a liquid may be jetted through the second sub-nozzle 111b. Optionally, a liquid may be jetted through the first sub-nozzle 111a, and a gas may be jetted through the second sub-nozzle 111b. In some example embodiments, fluids jetted through the first sub-nozzle 111a and the second sub-nozzle 111b may be in the same phase and have different components and/or compositions.

The position P1, which is cleaned by the fluid jetted from the first sub-nozzle 111a, may be located ahead of the position P2, which is cleaned by the fluid jetted from the second sub-nozzle 111b. In some example embodiments, a polar solvent such as surfactant-containing water, ammonia, or alcohol may be jetted through the first sub-nozzle 111a, and pure water may be jetted through the second sub-nozzle 111b. When such a configuration is used, since the wheel tips 145 may be cleaned at the position P1 by a polar solvent and then rinsed at the position P2, more efficient cleaning can be performed.

In FIGS. 6A and 6B, although the position P1 and the position P2, which are cleaned by the fluids, are shown as being in proximity to an advancing side of the wheel tip trace 145t toward the grinding zone 145z, for example, in proximity to the first-direction edge M, the inventive concepts is not limited thereto. In some example embodiments, the position P1 and the position P2, which are cleaned by the fluids, may be at a departing side of the wheel tip trace 145t from the grinding zone 145z.

Figure 7A:
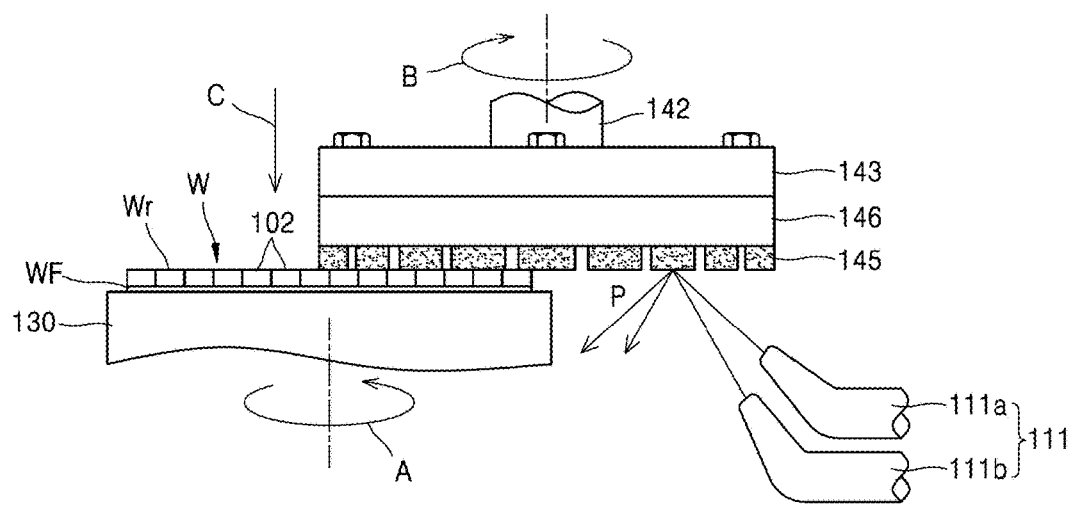
FIGS. 7A and 7B are respectively a side view and a plan view illustrating another example embodiment in which a cleaning device includes two or more nozzles.
Figure 7B:
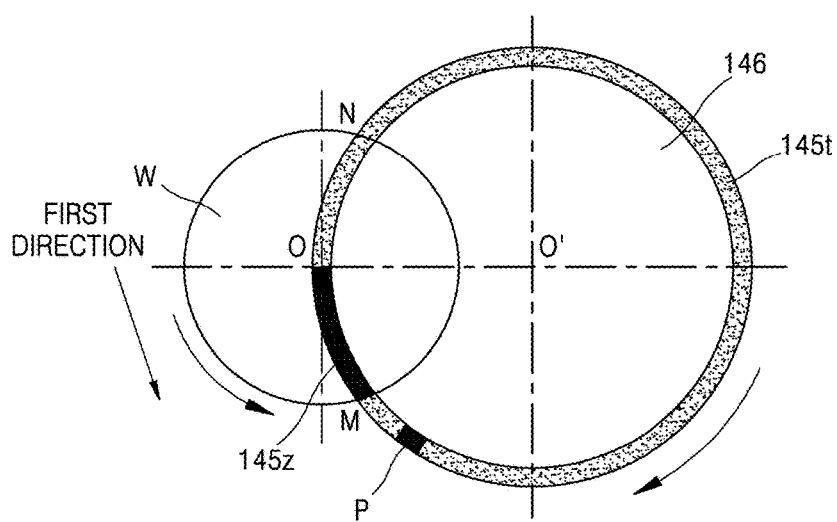

FIGS. 7A and 7B are respectively a side view and a plan view illustrating another example embodiment in which the cleaning device 111 includes two or more nozzles.

Referring to FIGS. 7A and 7B, the example embodiment differs from the example embodiment shown in FIGS. 6A and 6B in that the directions of the first sub-nozzle 111a and the second sub-nozzle 111b are adjusted such that the first sub-nozzle 111a and the second sub-nozzle 111b aim at the same position P.

Kinds of fluids which may be jetted through the first sub-nozzle 111a and the second sub-nozzle 111b may be as described with reference to FIGS. 6A and 6B. However, in the example embodiment, a stronger effect of cleaning can be realized since the fluids are jetted to the same position P.

FIGS. 8A to 8D are diagrams illustrating a timeline for performing the grinding of the substrate W and a timeline for performing the synchronized cleaning of the wheel tips 145, according to example embodiments. The grinding of the substrate W may temporally overlap the synchronized cleaning of the wheel tips 145. This is based on the description made with reference to FIG. 1. As described with reference to FIG. 1, the synchronized cleaning of the wheel tips 145 means that the grinding by the wheel tips 145 and the cleaning of the wheel tips 145 may be simultaneously or contemporaneously performed.

Figure 8A:
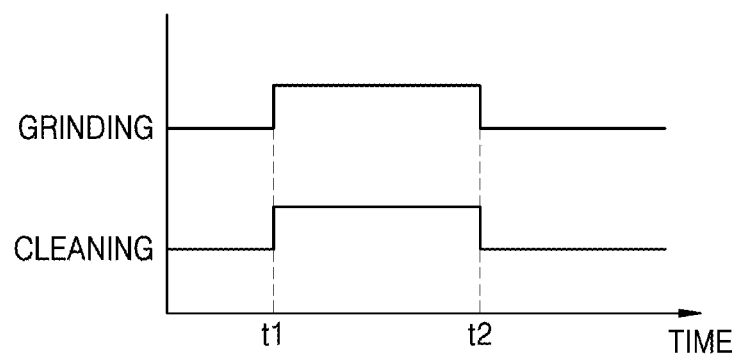
FIGS. 8A to 8D are diagrams illustrating a timeline of the grinding of a substrate and a timeline illustrating the synchronized cleaning of a wheel tip, according to example embodiments.

Referring to FIG. 8A, a start time t1 of the grinding of the substrate W may substantially coincide with an end time t2 of the synchronized cleaning of the wheel tips 145.

In this case, at the start time t1, the grinding of the substrate W may be performed simultaneously or contemporaneously with the cleaning of the wheel tips 145 grinding the substrate W. In addition, at the end time t2, the grinding of the substrate W may be terminated simultaneously or contemporaneously with the cleaning of the wheel tips 145 grinding the substrate W.

Figure 8B:
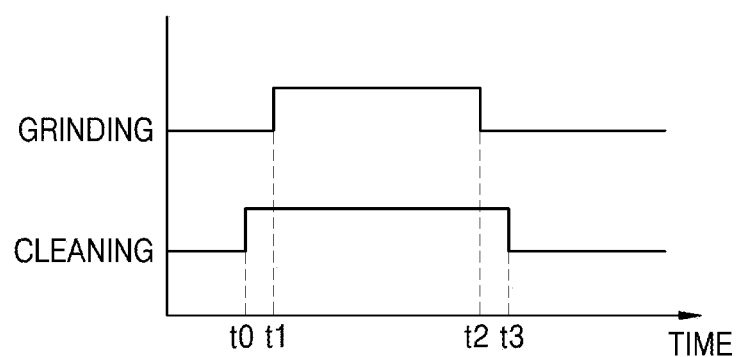

Referring to FIG. 8B, the start time and the end time of the grinding of the substrate W may respectively differ from the start time and the end time of the synchronized cleaning of the wheel tips 145. In particular, the grinding of the substrate W may be performed during the synchronized cleaning of the wheel tips 145.

In this case, a start time t0 of the synchronized cleaning of the wheel tips 145 may be earlier than a start time t1 of the grinding of the substrate W. In addition, an end time t3 of the synchronized cleaning of the wheel tips 145 may be later than an end time t2 of the grinding of the substrate W.

In this case, since the synchronized cleaning of the wheel tips 145 is continuously performed during the grinding of the substrate W, scratches due to the contamination of the wheel tips 145 can be significantly reduced and/or substantially prevented.

Figure 8C:
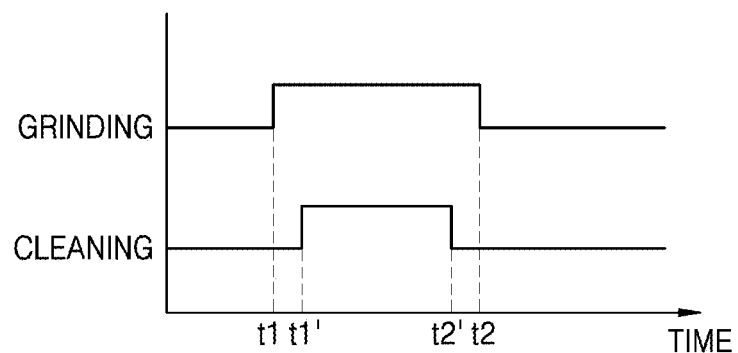

Referring to FIG. 8C, the start time and the end time of the grinding of the substrate W may respectively differ from the start time and the end time of the synchronized cleaning of the wheel tips 145, and in particular, the synchronized cleaning of the wheel tips 145 may be performed during the grinding of the substrate W.

In this case, a start time t1 of the grinding of the substrate W may be earlier than a start time t1' of the synchronized cleaning of the wheel tips 145. In addition, an end time t2 of the grinding of the substrate W may be later than an end time t2' of the synchronized cleaning of the wheel tips 145.

In this case, since the grinding wheel 146 may be more stably operated nearer the end time t2 of the grinding of the substrate W, a grinding thickness may be more precisely controlled.

Figure 8D:
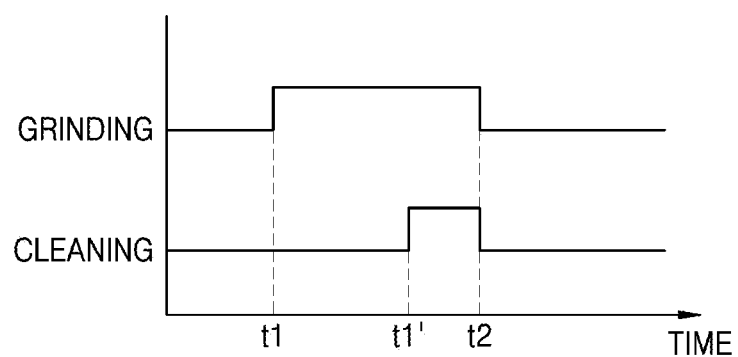

Referring to FIG. 8D, the start time of the grinding of the substrate W may be different from the start time of the synchronized cleaning of the wheel tips 145, and the end time of the grinding of the substrate W may be substantially equal to the end time of the synchronized cleaning of the wheel tips 145. More specifically, a start time t1 of the grinding of the substrate W may be earlier than a start time t1' of the synchronized cleaning of the wheel tips 145. In addition, the grinding of the substrate W and the synchronized cleaning of the wheel tips 145 may be simultaneously or contemporaneously terminated at an end time t2.

During an initial portion of a time period between the start time t1 and the end time t2, although the grinding of the substrate W is performed, the thickness of the substrate W is still thick, and a large amount of the wafer W to be grinded remains. Thus, even though scratches are generated on the surface of the substrate, the devices on the active surface may not be damaged. That is, even though the cleaning is started from the start time t1', which is a time point after the substrate W is somewhat grinded, the reliability of the semiconductor devices on the active surface may not be significantly affected.

In addition, if the cleaning of the substrate W is started from the start time t1', since the wheel tips 145 may be substantially continuously cleaned from this time point until the termination of the grinding, scratches on the grinded surface can be substantially prevented, and substantial reliability of the semiconductor devices can be maintained.

Figure 9:
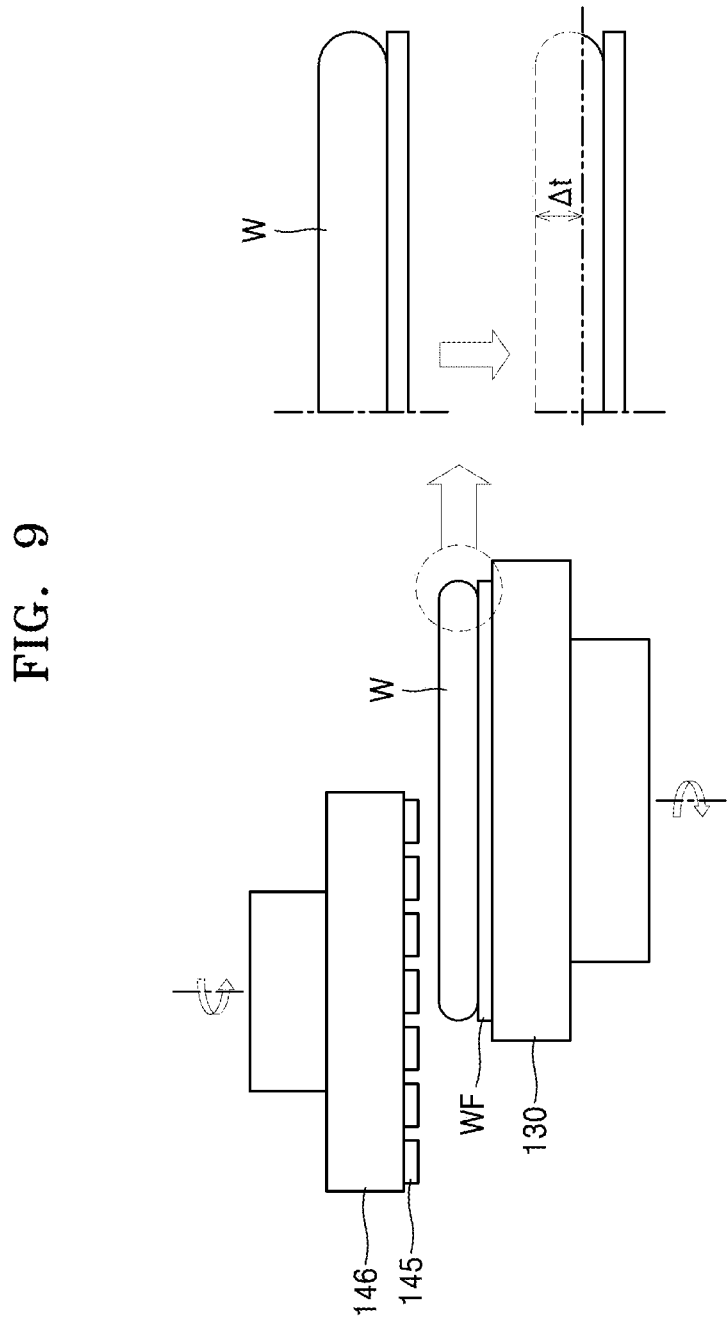
FIG. 9 is a conceptual diagram illustrating a thickness change of a grinded substrate, according to example embodiments.

FIG. 9 is a conceptual diagram illustrating a thickness change of the grinded substrate W, according to example embodiments.

Referring to FIG. 9, by using the grinding wheel 146 having the wheel tips 145, the substrate W fixed onto the chuck table 130 is subjected to thinning. A thickness change before and after the thinning is conceptually shown on the right side of FIG. 9.

The substrate W may have a thickness of about 400 μm to about 850 μm before the grinding. The substrate W may have a thickness of about 10 μm to about 200 μm after the grinding. A thickness change Δt of the substrate W due to thickness reduction by the thinning may range from about 400 μm to about 760 μm, or from about 500 μm to about 650 μm.

To precisely control the thickness of the substrate W, the grinding wheel 146 may be moved down (that is, in a direction toward the substrate W), for example, at a forward-speed of about 1 μm/sec.

Figure 10:
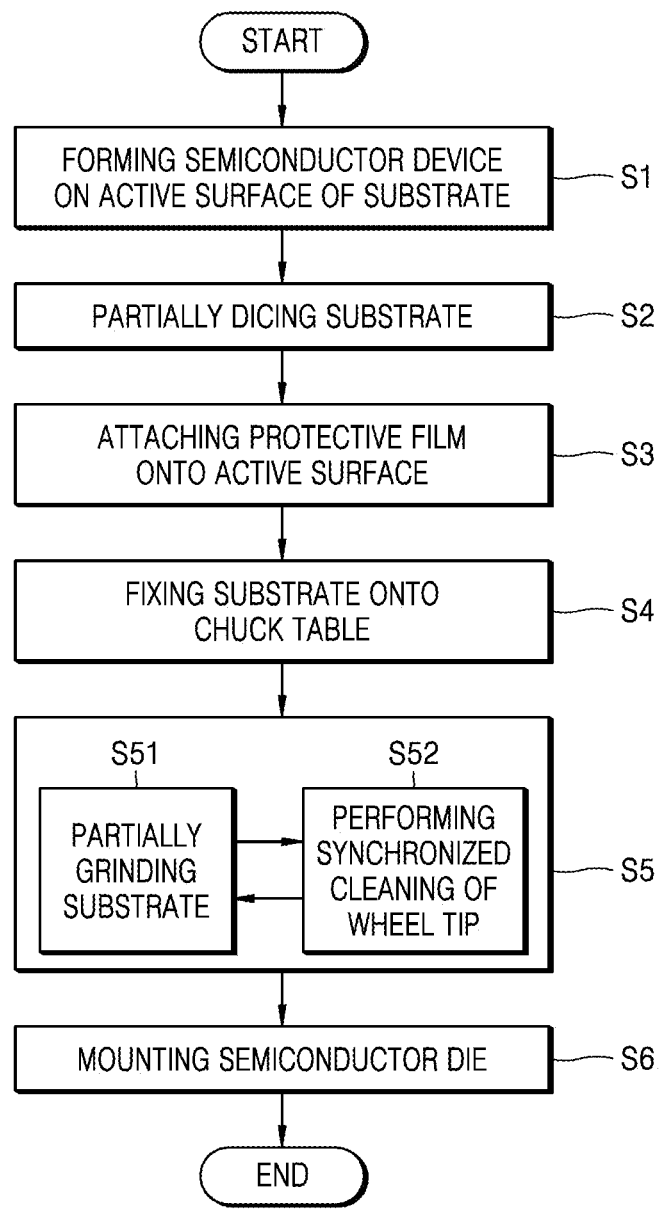
FIG. 10 is a flowchart of a method of fabricating a semiconductor package, according to an example embodiment.

FIG. 10 is a flowchart illustrating a method of fabricating a semiconductor package 1, according to an example embodiment. FIGS. 11 to 16 are diagrams illustrating a process order of the method of fabricating the semiconductor package 1, according to the example embodiment.

Figure 11:
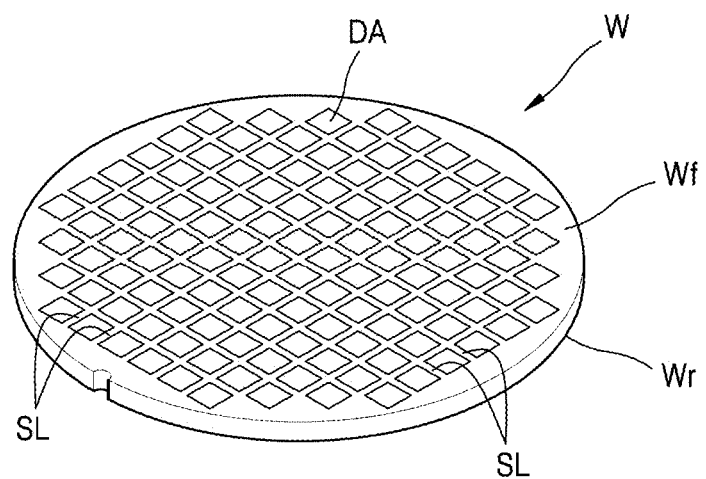
FIGS. 11 to 16 are diagrams illustrating a process order of a method of fabricating a semiconductor package, according to an example embodiment.

Referring to FIGS. 10 and 11, semiconductor devices may be formed on an active surface of the substrate W (S1).

The substrate W may include a semiconductor substrate. In some example embodiments, the substrate W may include a semiconductor such as Si or Ge. In some other example embodiments, the substrate W may include a compound semiconductor such as SiGe, SiC, GaAs, InAs, or InP. In some further example embodiments, the substrate W may have a silicon-on-insulator (SOI) structure.

A large number of semiconductor die areas DA, which include a large number of semiconductor devices and will be separated from each other afterwards, may be formed on an active surface Wf of the substrate W.

The semiconductor devices including a plurality of various individual devices may be formed on the semiconductor die areas DA. The plurality of individual devices may include various microelectronic devices, for example, a metal-oxide-semiconductor field effect transistor (MOSFET) such as a complementary metal-insulator-semiconductor (CMOS) transistor, a large scale integration (LSI), an image sensor such as a CMOS imaging sensor (CIS), a micro-electro-mechanical system (MEMS), an active device, a passive device, or the like. The plurality of individual devices may be electrically connected to a conductive region of the substrate W in the semiconductor die areas DA. The semiconductor devices may include at least two of the plurality of individual devices, or may further include a conductive wires or a conductive plug, which electrically connects the plurality of individual devices to the conductive region of the substrate W in the semiconductor die areas DA. In addition, each or at least one of the plurality of individual devices may be electrically isolated from other adjacent devices by an insulating film.

A semiconductor die obtained by separating the semiconductor die areas DA from each other may be, for example, a semiconductor memory chip. The semiconductor memory chip may be a volatile semiconductor memory chip such as dynamic random access memory (DRAM) or static random access memory (SRAM), or a non-volatile semiconductor memory chip such as phase-change random access memory (PRAM), magnetoresistive random access memory (MRAM), ferroelectric random access memory (FeRAM), or resistive random access memory (RRAM).

The substrate W may have a thickness of about 400 μm to about 850 μm. The semiconductor die areas DA may be distinguished from each other by a plurality of scribe lanes SL.

Figure 12:
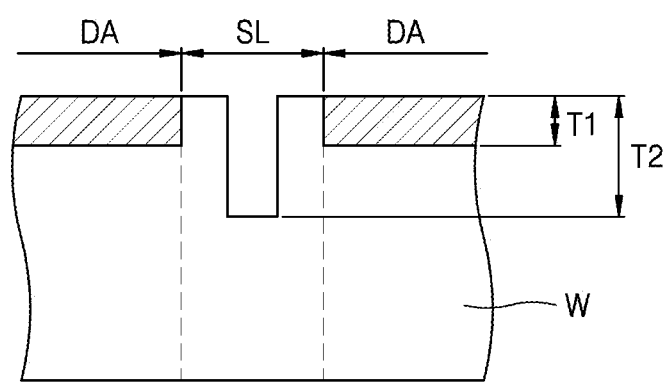

Referring to FIGS. 10 and 12, the substrate W may be at least partially diced along the plurality of scribe lanes SL of the substrate W (S2).

The substrate W is at least partially diced up to a certain depth T2 by using a sawing wheel. The depth T2 may be about 10% to about 60% of the thickness of the substrate W. In some example embodiments, the depth T2 may be greater than a depth T1 for forming the semiconductor devices. The depth T1 for forming the semiconductor devices may range from several micrometers to several tens of micrometers, for example, from about 5 μm to about 99 μm.

The sawing wheel may include a material exhibiting excellent tool properties, such as a hard metal (cemented carbide) or sintered diamond, and may be selected by taking account of the thickness, kind or the like of a material to be processed. The sawing wheel moves forward along the scribe lanes SL, thereby performing the at least partial dicing of the substrate W.

Referring to FIGS. 10 to 13, a protective film WF may be attached onto the active surface Wf of the substrate W (S3). The protective film WF may be, for example, a polyvinyl-chloride (PVC) polymer sheet, and may be attached onto the active surface Wf via an acrylic resin adhesive. The acrylic resin adhesive may have a thickness of about 2 μm to about 10 μm, and the protective film WF may have a thickness of about 60 μm to about 200 μm.

Figure 13:
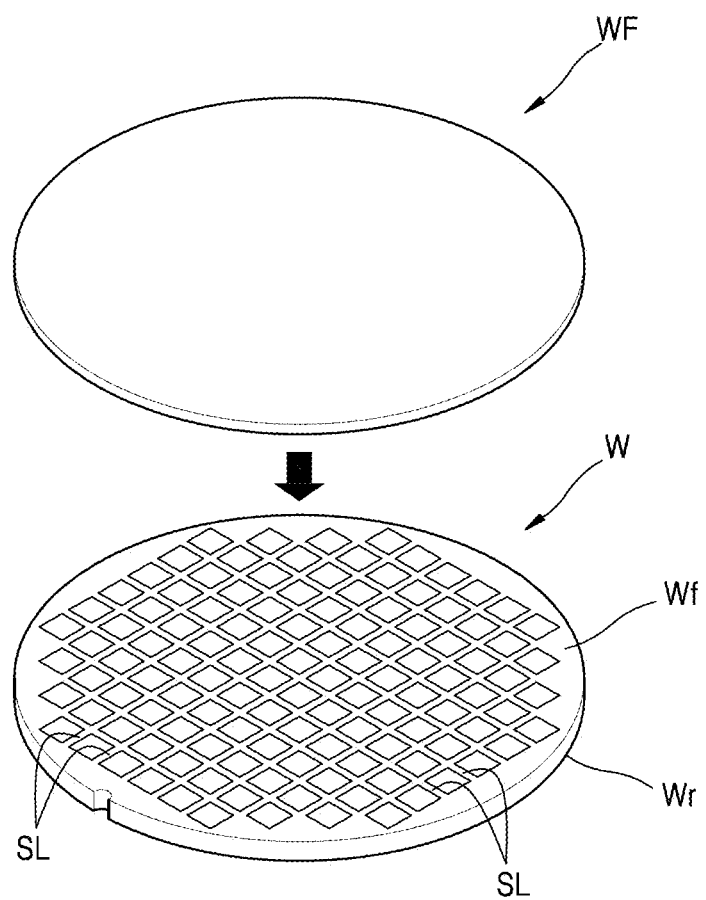
Figure 14:
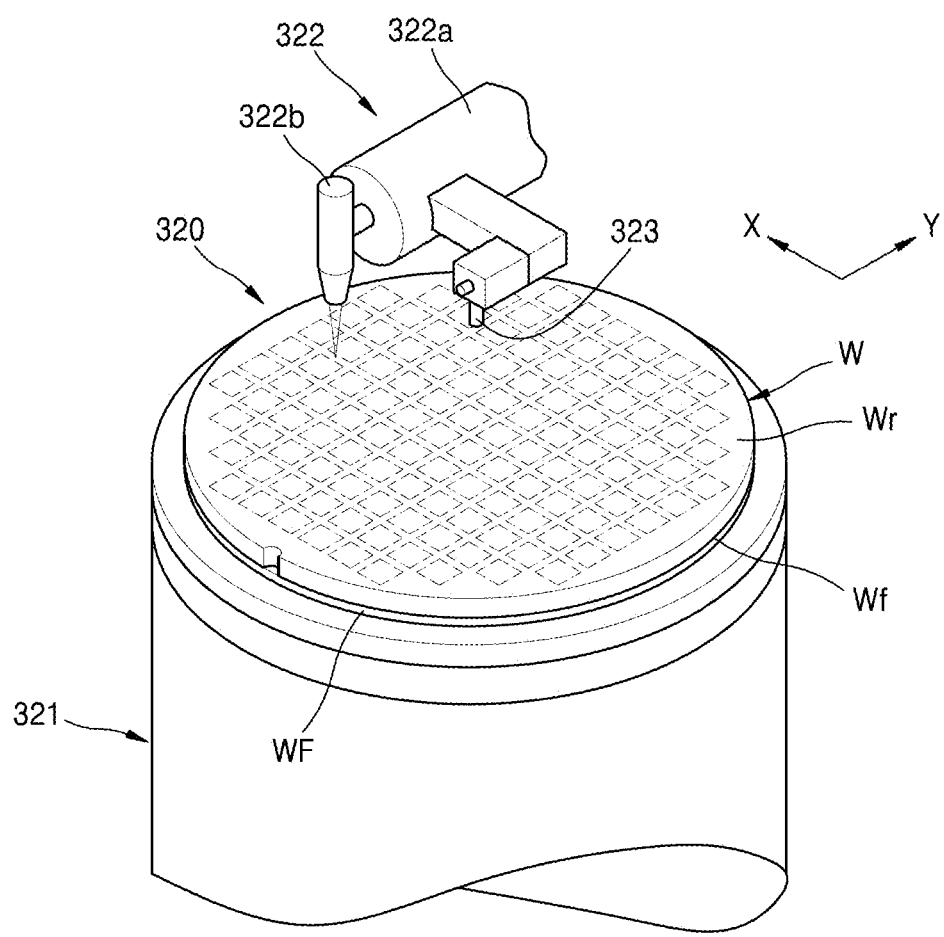

In FIGS. 12 and 13, an example embodiment, in which the at least partial dicing is performed on the surface of the substrate W, followed by attaching the protective film WF, is shown. However, the protective film WF may be attached first, followed by performing the at least partial dicing by using a laser. FIG. 14 is a perspective view illustrating a method of performing the at least partial dicing by using a laser, after the attaching of the protective film WF.

Referring to FIG. 14, the protective film WF may be formed on the active surface WF of the substrate W, followed by irradiating a laser beam onto the substrate W along the scribe lanes SL by determining a position of a focus inside the substrate W, the laser beam having a wavelength which has permeability with respect to the substrate W. As such, when the laser beam is irradiated onto the substrate W, a modified layer may be formed inside the substrate W along the scribe lanes SL. The modified layer may be formed by using a laser irradiating device 320 shown in FIG. 14.

The laser irradiating device 320 may include a chuck table 321 supporting the substrate W, a laser beam irradiating means 322 irradiating a laser beam onto the substrate W supported by the chuck table 321, and an imaging means 323 taking a picture of the substrate W supported by the chuck table 321. The chuck table 321 may suck and support the substrate W, and may be moved in the X direction and/or the Y direction.

The laser beam irradiating means 322 may be configured such that a concentrator 322b mounted to an end of the casing 322a irradiates a pulsed laser beam, the casing 322a having a cylindrical shape and being substantially horizontally arranged. In addition, the imaging means 323, which is mounted to an end of the casing 322a constituting the laser beam irradiating means 322, may include a general CCD imaging device taking a picture by using visible light or an infrared CCD imaging device, the infrared CCD imaging device including an infrared irradiating means irradiating infrared rays onto the substrate W and optics detecting the infrared rays irradiated by the infrared irradiating means, the infrared CCD imaging device outputting electrical signals corresponding to the infrared rays detected by the optics.

The laser beam irradiating means 322 is aligned with a laser beam irradiating position and then irradiates the laser beam. A focus of the laser beam may be adjusted at a middle point of the substrate W in a thickness direction of the substrate W. In addition, while the concentrator 322b irradiates the laser beam of a wavelength having permeability with respect to the substrate W, the chuck table 321 and the concentrator 322b may be relatively moved at appropriate speeds.

Figure 15:
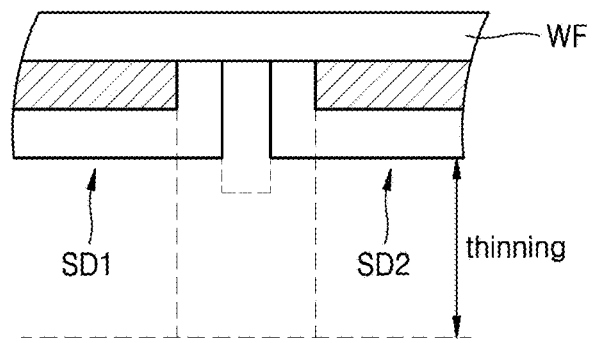

Referring to FIGS. 10 and 15, the at least partially diced substrate W is subjected to thinning according to the method described with reference to FIGS. 1 to 9 (S5).

As described with reference to FIGS. 1 to 9, the thinning of the substrate W may include at least partially grinding the substrate W (S51) and performing synchronized cleaning of the wheel tips 145 (S52). As described with reference to FIGS. 8A to 8D, the at least partially grinding of the substrate W (S51) may temporally overlap the synchronized cleaning of the wheel tips 145 (S52) in various manners.

Since the at least partially grinding of the substrate W (S51) and the synchronized cleaning of the wheel tips 145 (S52) have been described in detail with reference to FIGS. 1 to 9, overlapping descriptions thereof will be omitted.

Semiconductor dies SD1 and SD2 may be separated from each other by the thinning. By the thinning, portions of the substrate W may be removed in the thickness direction of the substrate W such that the rear surface of the substrate W changes from an original level up to a level beyond the depth formed by at least partial dicing the substrate W. That is, since the thickness of the portions of the substrate W removed by the thinning exceeds the depth formed by the at least partial dicing of the substrate W, the semiconductor dies SD1 and SD2 may be separated from each other and individualized. However, since the semiconductor dies SD1 and SD2 are attached onto the protective film WF, the semiconductor dies SD1 and SD2 may be maintained at original positions thereof instead of being disorderedly scattered.

Figure 16:
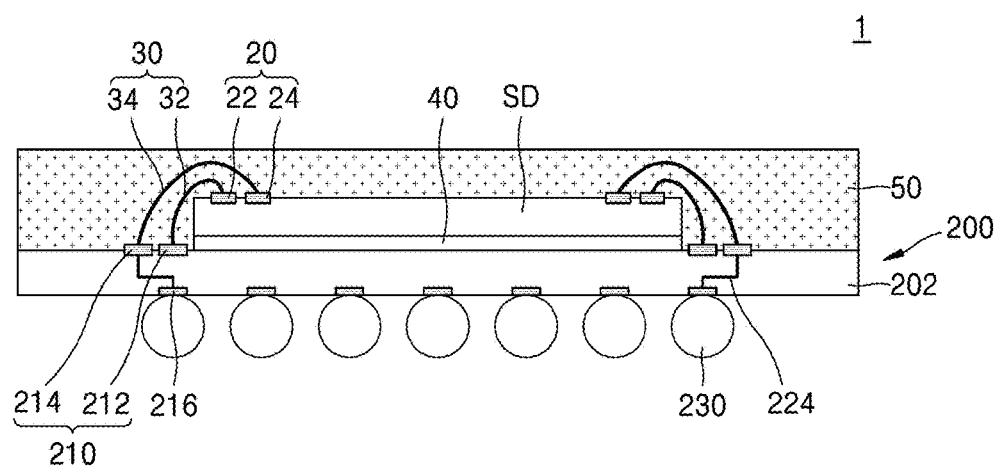

Referring to FIGS. 10 and 16, the semiconductor package 1 may be fabricated by mounting the individualized semiconductor dies.

The semiconductor package 1 may include a package base substrate 200 and a semiconductor die SD. The package base substrate 200 may be, for example, a printed circuit board, a ceramic substrate, or an interposer.

When the package base substrate 200 is a printed circuit board, the package base substrate 200 may include a substrate base 202, a bonding pad 210, and a connection pad 216, the bonding pad 210 and the connection pad 216 being respectively formed on upper and lower surfaces of the substrate base 202. The bonding pad 210 and the connection pad 216 may be respectively exposed by solder resist layers (not shown) covering the upper and lower surfaces of the substrate base 202. The substrate base 202 may include at least one material selected from among a phenol resin, an epoxy resin, and a polyimide. For example, the substrate base 202 may include at least one material selected from among FR4, an tetrafunctional epoxy, a polyphenylene ether, an epoxy/polyphenylene oxide, bismaleimide triazine (BT), Thermount, a cyanate ester, a polyimide, and a liquid crystal polymer. Each or at least one of the bonding pad 210 and the connection pad 216 may include copper, nickel, stainless steel, or beryllium copper. An inner wire 224 may be formed in the substrate base 202, the inner wire 224 providing an electrical connection between the bonding pads 210 and/or between the bonding pad 210 and the connection pad 216. The inner wire 224 may be formed inside the substrate base 202, without being limited thereto. The inner wire 224 may be formed on the upper and/or lower surfaces of the substrate base 202 and covered by the solder resist layers. The bonding pad 210 and the connection pad 216 may be portions of circuit wires, which are exposed by the solder resist layers, respectively, the circuit wires being patterned after coating Cu foil onto the upper and lower surfaces of the substrate base 202.

When the package base substrate 200 is an interposer, the substrate base 202 may include, for example, a silicon wafer.

A connection terminal 230 may be attached onto a lower surface of the package base substrate 200. The connection terminal 230 may be, for example, a solder ball or a solder bump. The connection terminal 230 may electrically connect the semiconductor package 1 to a device external to the semiconductor package 1.

The semiconductor die SD may include a plurality of chip pads 20 on an upper surface thereof. The plurality of chip pads 20 may be electrically connected to a plurality of corresponding bonding pads 210 through bonding wires 30, respectively. The chip pad 20 may include a first chip pad 22 and a second chip pad 24. The bonding pad 210 may include a first bonding pad 212 and a second bonding pad 214.

The bonding wire 30 may include a first bonding wire 32 connecting the first chip pad 22 to the first bonding pad 212 and a second bonding wire 34 connecting the second chip pad 24 to the second bonding pad 214.

The inner wire 224 in the package base substrate 200 may connect the second bonding pad 214 to the connection pad 216.

The substrate package 1 may further include a molding layer 50, which is formed on the package base substrate 200 and surrounds the upper surface of the package base substrate 200, the semiconductor die SD, and the bonding wire 30. The molding layer 50 may include, for example, an epoxy mold compound (EMC).

The semiconductor die SD may be attached onto the package base substrate 200 via a die-attach film 40. The semiconductor die SD may be attached onto the package base substrate 200 such that an active surface of the semiconductor die SD faces an opposite side to the package base substrate 200, that is, an inactive surface of the semiconductor die SD faces the package base substrate 200. The die-attach film 40 may include a binder component and a curing component. The binder component may include, for example, an acrylic polymer resin and/or an epoxy resin. The curing component may include, for example, an epoxy resin, a phenolic curing resin, or a phenoxy resin. Alternatively, the curing component may simultaneously or contemporaneously serve as the binder component. The die-attach film 40 may further include an additive, such as a curing catalyst or a silane coupling agent, and a filler. The curing catalyst may be, for example, a phosphine, imidazole, or amine curing catalyst. The silane coupling agent may be, for example, a mercaptosilane coupling agent or an epoxysilane coupling agent. The filler may be, for example, silica.

When the substrate thinning apparatus according to the inventive concepts is used, even a significantly thin semiconductor device can be fabricated with substantial reliability.

Figure 17:
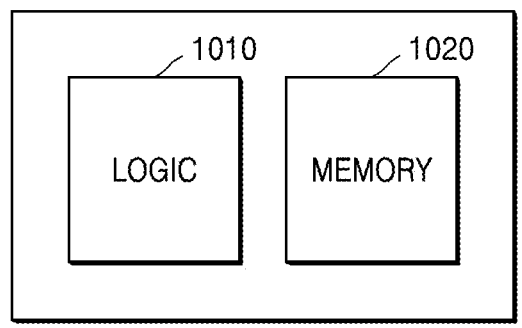
FIG. 17 is a block diagram of an electronic device according to example embodiments.

FIG. 17 is a block diagram of an electronic device according to example embodiments.

Referring to FIG. 17, an electronic device 1000 includes a logic area 1010 and a memory area 1020.

The logic area 1010 may include various logic cells including a plurality of circuit elements, such as transistors, registers, and the like, as standard cells performing desired logic functions, such as counters, buffers, and the like. The logic cells may include, for example, AND, NAND, OR, NOR, exclusive OR (XOR), exclusive NOR (XNOR), inverter (INV), adder (ADD), buffer (BUF), delay (DLY), filter (FILL), multiplexer (MXT/MXIT), OR/AND/IN-VERTER (OAI), AND/OR (AO), AND/OR/INVERTER (AOI), D flip-flop, reset flip-flop, master-slave flip-flop, latch logic cells, and the like. However, the logic cells set forth above are merely examples, and the inventive concepts are not limited thereto.

The memory area 1020 may include at least one of SRAM, DRAM, MRAM, RRAM, and PRAM.

The logic area 1010 and the memory area 1020 may include at least one of integrated circuit devices, which are obtained by the method described with reference to FIGS. 1 to 9, and integrated circuit devices, which have various structures modified and changed therefrom without departing from the spirit and scope of the inventive concepts.

Figure 18:
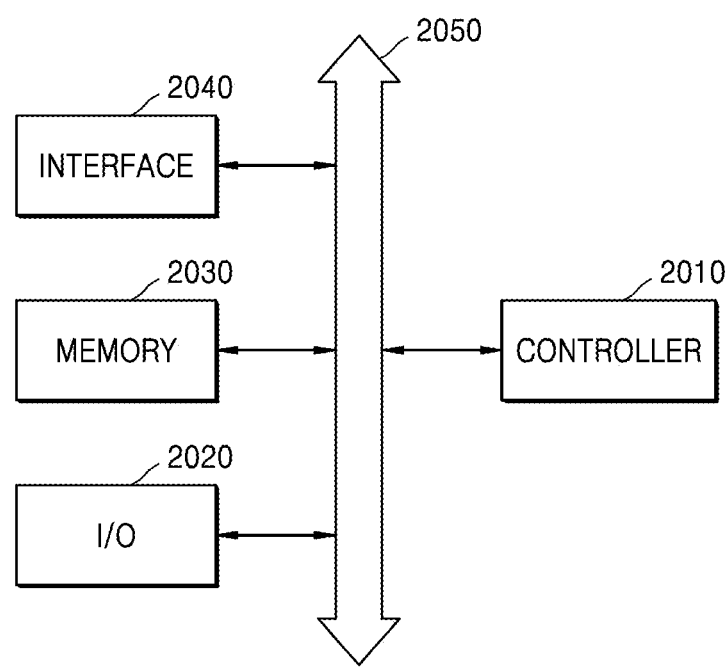
FIG. 18 is a block diagram of an electronic system according to example embodiments.

FIG. 18 is a block diagram of an electronic system according to example embodiments.

Referring to FIG. 18, an electronic system 2000 includes a controller 2010, an input/output (I/O) device 2020, a memory 2030, and an interface 2040, and these components are connected to each other through a bus 2050.

The controller 2010 may include at least one of microprocessors, digital signal processors, and processing devices similar thereto or the same thereas. The input/output device 2020 may include at least one of keypads, keyboards, and displays. The memory 2030 may be used to store commands executed by the controller 2010. For example, the memory 2030 may be used to store user data.

The electronic system 2000 may constitute a wireless communication device, or a device capable of transmitting and/or receiving information in a wireless environment. In the electronic system 2000, to transmit/receive data through a wireless communication network, the interface 2040 may be configured as a wireless interface. The interface 2040 may include an antenna and/or a wireless transceiver. In some example embodiments, the electronic system 2000 may be used for a communication interface protocol of a third generation communication system, such as code division multiple access (CDMA), global system for mobile communications (GSM), North American digital cellular (NADC), extended-time division multiple access (E-TDMA), and/or wide band code division multiple access (WCDMA) systems. The electronic system 2000 may include at least one of integrated circuit devices, which are obtained by the method described with reference to FIGS. 1 to 9, and integrated circuit devices, which have various structures modified and changed therefrom without departing from the spirit and scope of the inventive concepts.

While the inventive concepts has been particularly shown and described with reference to example embodiments thereof, it will be understood that various changes in form and details may be made therein without departing from the spirit and scope of the following claims.

What is claimed is:

1. A method of thinning a substrate, the method comprising:
   fixing a substrate onto a chuck table;
   at least partially grinding the substrate by rotating a grinding device including a wheel tip; and
   performing synchronized cleaning of the wheel tip;
   wherein the synchronized cleaning of the wheel tip includes jetting a cleaning fluid toward the wheel tip in an area of the wheel tip that is not in contact with the substrate during the grinding of the substrate.

2. The method according to claim 1, further comprising, before the fixing of the substrate onto the chuck table:
   at least partially dicing the substrate along a scribe lane of the substrate; and
   attaching a protective film onto an active surface of the substrate.

3. The method according to claim 1, wherein the synchronized cleaning of the wheel tip is performed during the at least partial grinding of the substrate.

4. The method according to claim 1, wherein the at least partial grinding of the substrate is performed substantially during the synchronized cleaning of the wheel tip.

5. The method according to claim 1, wherein the at least partial grinding of the substrate is performed on an area of the substrate between the center of the substrate and a first-direction edge of the substrate with respect to the center of the substrate.

6. The method according to claim 5, wherein the grinding device is brought into contact with the substrate in a direction extending from the center of the substrate toward the first-direction edge of the substrate by the rotation of the grinding device.

7. The method according to claim 5, wherein the grinding device is brought into contact with the substrate in a direction extending from the first-direction edge of the substrate toward the center of the substrate by the rotation of the grinding device.

8. The method according to claim 7, wherein a cleaning fluid is jetted toward the wheel tip located in proximity to the first-direction edge.

9. A method of fabricating a semiconductor package, the method comprising:
   forming a semiconductor device on an active surface of a substrate;
   attaching a protective film onto the active surface of the substrate;
   fixing the substrate onto a chuck table such that the active surface of the substrate faces the chuck table;
   at least partially grinding the substrate by rotating a grinding device including a wheel tip;
   performing synchronized cleaning of the wheel tip;

separating the grinded substrate into individual semiconductor dies; and fabricating a semiconductor package by mounting the individual semiconductor dies;

wherein the synchronized cleaning of the wheel tip includes jetting a cleaning fluid toward the wheel tip in an area of the wheel tip that is not in contact with the substrate during the grinding of the substrate.

10. The method according to claim 9, wherein a thickness of the substrate reduced by the at least partial grinding of the substrate ranges from about 400 μm to about 760 μm.

11. The method according to claim 9, wherein the at least partial grinding of the substrate comprises rotating the chuck table and the grinding device, and a rotation rate in revolutions per minute (rpm) of the grinding device is about 5 times to about 20 times a rotation rate in revolutions per minute of the chuck table.

12. The method according to claim 9, wherein a start time of the at least partial grinding of the substrate is earlier than a start time of the synchronized cleaning of the wheel tip, and an end time of the at least partial grinding of the substrate is substantially equal to an end time of the synchronized cleaning of the wheel tip.

13. A method for grinding a substrate, the method comprising:

fixedly attaching a substrate to a support;

at least partially grinding the substrate by rotating a grinding device including a plurality of wheel tips, at least one of the plurality of wheel tips being in contact with at least a portion of the substrate; and projecting a compressed fluid onto the at least one of the plurality of wheel tips in an area of the at least one of the plurality of wheel tips that is not in contact with the substrate;

wherein the projecting is performed contemporaneously with the at least partial grinding.

14. The method of claim 13, further comprising rotating the substrate in a direction opposite to a rotating direction of the grinding device contemporaneously with the rotating of the grinding device.

15. The method of claim 14, wherein:

the rotating the grinding device is performed at a rate of about 1500 rpm to about 7200 rpm; and the rotating the substrate is performed at a rate of about 200 rpm to about 400 rpm.

16. The method of claim 13, wherein the compressed fluid comprises at least one liquid and at least one gas.

17. The method of claim 16, wherein the compressed fluid comprises at least one of air, nitrogen ($N_2$), helium (He), neon (Ne), water, ammonia, alcohol, a surfactant, or mixtures thereof.

18. The method of claim 16, wherein the projecting the compressed fluid comprises:

projecting the at least one liquid via a first nozzle; and projecting the at least one gas via a second nozzle.

* * * * *